United States Patent
Roth et al.

(10) Patent No.: US 10,878,997 B2
(45) Date of Patent: Dec. 29, 2020

(54) INTEGRATED CIRCUIT HAVING CURRENT-SENSING COIL

(71) Applicant: TAIWAN SEMICONDUCTOR MANUFACTURING COMPANY, LTD., Hsinchu (TW)

(72) Inventors: Alan Roth, Leander, TX (US); Eric Soenen, Austin, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1065 days.

(21) Appl. No.: 15/053,619

(22) Filed: Feb. 25, 2016

(65) Prior Publication Data

US 2016/0268042 A1    Sep. 15, 2016

Related U.S. Application Data

(60) Provisional application No. 62/133,228, filed on Mar. 13, 2015.

(51) Int. Cl.
| | |
|---|---|
| *H01F 38/30* | (2006.01) |
| *G01R 15/18* | (2006.01) |
| *H01F 5/00* | (2006.01) |
| *H01L 23/522* | (2006.01) |

(52) U.S. Cl.
CPC ........... *H01F 38/30* (2013.01); *G01R 15/183* (2013.01); *H01F 5/003* (2013.01); *H01L 23/5227* (2013.01)

(58) Field of Classification Search
CPC . H01L 23/5227; H01L 28/10; H01L 25/0657; G01R 15/202
See application file for complete search history.

(56) References Cited

U.S. PATENT DOCUMENTS

| | | |
|---|---|---|
| 5,963,038 A | 10/1999 | De Jong et al. |
| 8,279,008 B2 | 10/2012 | Hsieh et al. |
| 8,427,240 B2 | 4/2013 | Hsieh et al. |
| 8,593,206 B2 | 11/2013 | Chen et al. |

(Continued)

FOREIGN PATENT DOCUMENTS

| | | |
|---|---|---|
| FR | 2942880 | 9/2010 |
| JP | 2003315373 | 11/2003 |
| JP | 2008016770 | 1/2008 |

OTHER PUBLICATIONS

Translation of JP2008016770.*

(Continued)

*Primary Examiner* — Huy Q Phan
*Assistant Examiner* — Adam S Clarke
(74) *Attorney, Agent, or Firm* — Hauptman Ham, LLP

(57) ABSTRACT

An integrated circuit includes a substrate, a first conductive path over the substrate, a coil structure over the substrate, and a voltage sensing circuit electrically coupled with the coil structure. The first conductive path is configured to carry a first time-varying current and to generate a first time-varying magnetic field based on the first time-varying current. The coil structure is magnetically coupled with the first conductive path through the first time-varying magnetic field and is configured to generate an induced electrical potential responsive to the first time-varying magnetic field. The voltage sensing circuit is configured to measure a voltage level of the induced electrical potential.

20 Claims, 7 Drawing Sheets

(56) References Cited

U.S. PATENT DOCUMENTS

| | | |
|---|---|---|
| 8,610,494 B1 | 12/2013 | Jin et al. |
| 8,618,631 B2 | 12/2013 | Jin et al. |
| 8,912,581 B2 | 12/2014 | Lin et al. |
| 8,941,212 B2 | 1/2015 | Yen et al. |
| 9,184,256 B2 | 11/2015 | Huang et al. |
| 9,209,521 B2 | 12/2015 | Hung et al. |
| 2002/0095777 A1* | 7/2002 | Ahn .................. H01F 17/0033 29/604 |
| 2005/0035761 A1 | 2/2005 | Park et al. |
| 2005/0190035 A1 | 9/2005 | Wang et al. |
| 2006/0232902 A1* | 10/2006 | Woolsey ............. G01R 15/202 361/93.1 |
| 2008/0186123 A1* | 8/2008 | Wei .................... H01F 17/0013 336/200 |
| 2009/0128279 A1 | 5/2009 | Matsushita et al. |
| 2009/0230955 A1 | 9/2009 | Kejik et al. |
| 2011/0199073 A1 | 8/2011 | Myers et al. |
| 2011/0279214 A1 | 11/2011 | Lee et al. |
| 2012/0018842 A1* | 1/2012 | Nakajima ............... H01F 21/02 257/531 |
| 2014/0092574 A1 | 4/2014 | Zillmann et al. |
| 2014/0132333 A1 | 5/2014 | Jin et al. |
| 2014/0167786 A1* | 6/2014 | Gutierrez ............. G01R 15/181 324/654 |
| 2014/0253262 A1 | 9/2014 | Hsieh et al. |
| 2014/0253391 A1 | 9/2014 | Yen |
| 2014/0256063 A1 | 9/2014 | Yang et al. |
| 2015/0364417 A1 | 12/2015 | Lee |

OTHER PUBLICATIONS

Notice of Allowance dated Jan. 22, 2018 and English translation from corresponding application No. KR 10-2016-0029754.
Office Action dated Apr. 17, 2017 from corresponding application No. KR 10-2016-0029754.
Office Action dated Dec. 12, 2017 from corresponding application No. TW 105106999.
Office Action dated Jul. 16, 2018 from corresponding application No. DE 102016103608.0.

* cited by examiner

INTEGRATED CIRCUIT HAVING CURRENT-SENSING COIL

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of an IC. In some applications, an IC includes electrical components, such as a voltage regulator, that the operations thereof are sometimes based on measuring their currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
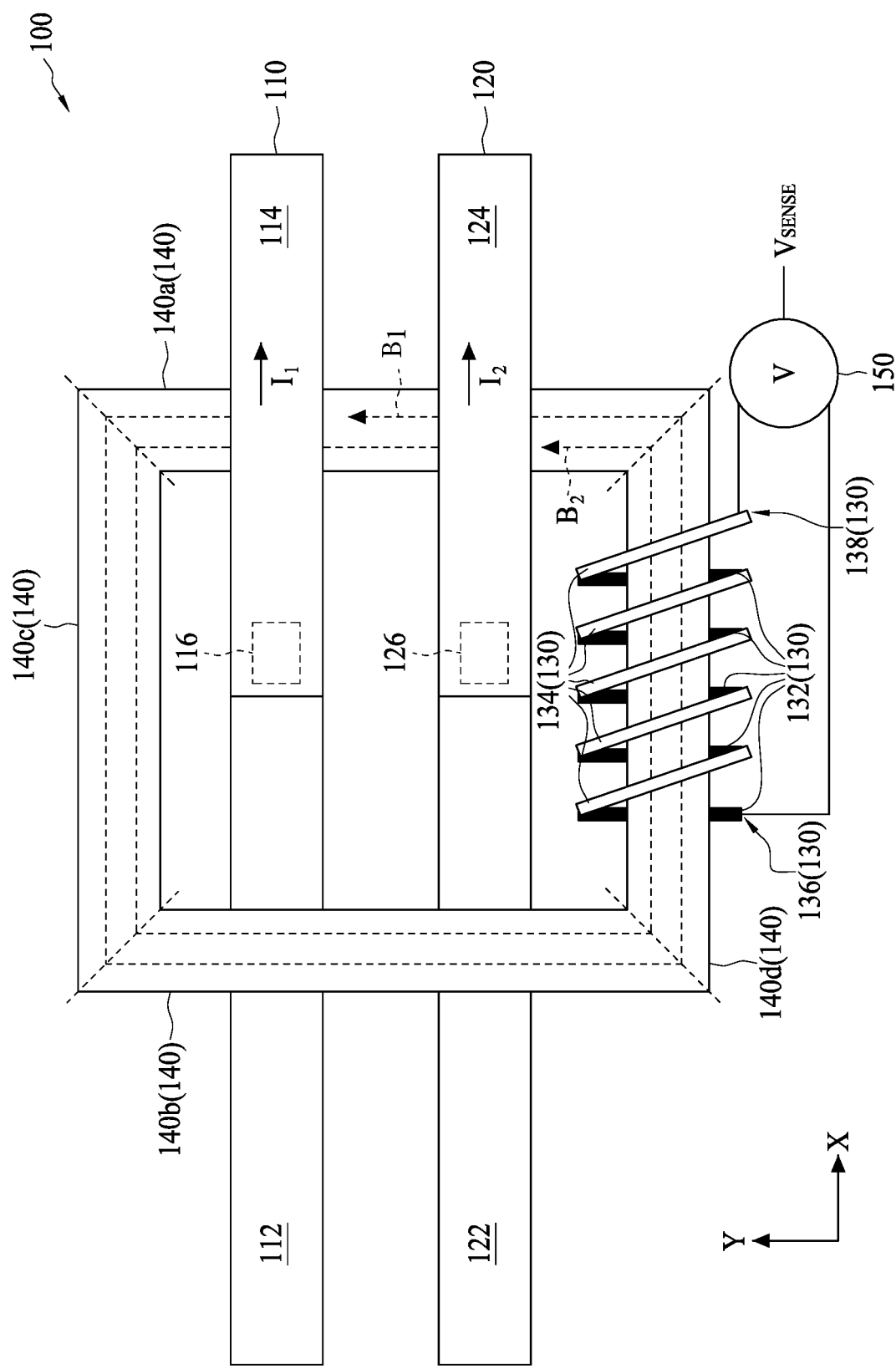
FIG. 1 is a top view of a portion of an integrated circuit in accordance with one or more embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain applications, such as voltage regulators, use high speed and accurate in-situ current measurements. This disclosure, in various embodiments, presents several methods of implementing an on-die transformer-based current sensor.

In various applications, voltage regulators rely on voltage feedback or current feedback in order to implement the control loop for high speed and high accuracy regulation. In some embodiments, it is desirable for voltage regulators to have as fast as possible control loop in order to respond to transient events in the minimum time. In some embodiments, current feedback provides a faster response than voltage feedback.

The present disclosure describes various embodiments of measuring current values in an integrated circuit. In some embodiments, performing transformer-based current sensing operations is provided. In some embodiments, current in the primary path (e.g., an electrical path in an output stage) is magnetically coupled with a sense stage. An alternating current (AC) component of the current is magnetically coupled and measured. One possible application is to measure a current value for a switched regulator, where a half-bridge rectifier thereof produces an AC current on a switching side of an inductor of the switched regulator. In some embodiments, an output current value of the switched regulator is also determinable based on the measured current value of the AC current on the switching side of the inductor.

FIG. 1 is a top view of a portion of an integrated circuit 100 in accordance with one or more embodiments. Integrated circuit 100 includes a substrate (e.g., 410 in FIG. 4), a first conductive path 110 over the substrate, a second conductive path 120 over the substrate, a coil structure 130 (not labeled in FIG. 1) over the substrate, a ferromagnetic structure 140 over the substrate, and a voltage sensing circuit 150.

First conductive path 110 extends along an X direction. First conductive path 110 includes a first conductive line 112 under ferromagnetic structure 140, a second conductive line 114 over ferromagnetic structure 140, and a via plug 116 connecting first conductive line 112 and second conductive line 114. In some embodiments, via plug 116 is coplanar with ferromagnetic structure 140. In some embodiments, first conductive path 110 is configured to carry a first time-varying current I1 and to generate a first time-varying magnetic field B1 based on first time-varying current I1.

Second conductive path 120 extends along X direction. Second conductive path 120 includes a first conductive line 122 under ferromagnetic structure 140, a second conductive line 124 over ferromagnetic structure 140, and a via plug 126 connecting first conductive line 122 and second conductive line 124. In some embodiments, via plug 126 is coplanar with ferromagnetic structure 140. In some embodiments, second conductive path 120 is configured to carry a second time-varying current I2 and to generate a second time-varying magnetic field B2 based on second time-varying current I2.

Two conductive paths 110 and 120 are explained as an example. In some embodiments, one of conductive paths 110 and 120 is omitted, and only the current on the remaining conductive path is measured. In some embodiments, three or more conductive paths are arranged in a manner similar to conductive paths 110 and 120, and the current values of the three or more conductive paths are measured based on their corresponding magnetic fields.

Ferromagnetic structure 140 comprises a ferromagnetic ring having four portions 140a, 140b, 140c, and 140d. Portions 140a and 140b of ferromagnetic structure 140 extend along a direction Y different from direction X, and portions 140c and 140d of ferromagnetic structure 140 extend along direction X. In some embodiments, ferromagnetic structure 140 has a magnetic permeability higher than a magnetic permeability of free-space or a magnetic permeability of a dielectric material (e.g., material 442 or passivation layer 430 in FIG. 4) adjacent to ferromagnetic structure 140. In some embodiments, ferromagnetic structure 140 has a material including cobalt, zirconium, or tantalum, or other suitable materials. In some embodiments, ferromagnetic structure 140 includes an alloy of cobalt, zirconium, and tantalum or other suitable materials. In some embodiments, ferromagnetic structure 140 is configured to direct at least a portion of first time-varying magnetic field B1 and/or second time-varying magnetic field B2 to pass through a coil structure 130.

Coil structure 130 is wrapped around portion 140d of ferromagnetic structure 140 by a predetermined number of turns. For example, in some embodiments, coil structure 130 in FIG. 1 has five turns. In some embodiments, coil structure 130 has a number of turns other than 5. Coil structure 130 includes a first plurality of conductive lines 132 under ferromagnetic structure 140 and a second plurality of conductive lines 134 over ferromagnetic structure 140. In some embodiments, the greater the number of turns in coil structure 130, the greater the voltage level of an induced potential.

Coil structure 130 has a first end 136 and a second end 138. Coil structure 130 is magnetically coupled with the first conductive path 110 and/or second conductive path 120 through the first time-varying magnetic field B1 and/or second time-varying magnetic field B2. Coil structure 130 is configured to generate an induced electrical potential responsive to the first time-varying magnetic field B1 and/or second time-varying magnetic field B2. The voltage level of the induced electrical potential is measurable from the ends 136 and 138 of coil structure 130.

Voltage sensing circuit 150 is electrically coupled with the ends 136 and 138 of coil structure 130 and is configured to measure the voltage level of the induced electrical potential of coil structure 130. The measurement result is output as signal $V_{SENSE}$. Based on the phases or directions of current I1 and current I2 and Ampere's right-hand rule, first time-varying magnetic field B1 and second time-varying magnetic field B2 are superposed, as observed by the coil structure 130, in an additive manner or a subtractive manner. For example, if current I1 and current I2 are arranged in a same direction and do not have a phase offset, then the first time-varying magnetic field B1 and the second time-varying magnetic field B2, as observed by the coil structure 130, are additive and signal $V_{SENSE}$ is usable to measure an amplitude of current (I1+I2). For example, if current I1 and current I2 are arranged in an opposite direction and do not have a phase offset, then the first time-varying magnetic field B1 and the second time-varying magnetic field B2, as observed by the coil structure 130, are subtractive and signal $V_{SENSE}$ is usable to measure an amplitude of current (I1−I2). Therefore, depending on the configuration of conductive paths 110 and 120, signal $V_{SENSE}$ is usable to measure an amplitude of (I1+I2) or (I1−I2).

In some embodiments, voltage sensing circuit 150 is in the integrated circuit 100 on which the conductive path 110 and/or 120 and coil structure 130 are formed. In some embodiments, voltage sensing circuit 150 is outside the integrated circuit 100.

In some embodiments, integrated circuit 100 includes a first interconnection layer (e.g., one of the plurality of interconnection layers 420 in FIG. 4) over the substrate, and ferromagnetic structure 140 is over the first interconnection layer 420. In some embodiments, integrated circuit 100 includes a second interconnection layer (e.g., interconnection layer 450 in FIG. 4) over the substrate, and second interconnection layer 450 is over ferromagnetic structure 140. In some embodiments, a passivation layer (e.g., passivation layer 430 in FIG. 4) is over the first interconnection layer 420, and ferromagnetic structure 140 is over the passivation layer 430. In some embodiments, ferromagnetic structure 140 is at least partially embedded in the passivation layer 430.

In some embodiments, the first plurality of conductive lines 132 is in first interconnection layer 420, and the second plurality of conductive lines 134 is in the second interconnection layer 450. The first plurality of conductive lines 132 and the second plurality of conductive lines 134 are connected through corresponding via plugs.

In some embodiments, the first conductive line 112 of first conductive path 110 is in the first interconnection layer 420. In some embodiments, the second conductive line 114 of first conductive path 110 is in the second interconnection layer 450. In some embodiments, the first conductive line 122 of second conductive path 120 is in the first interconnection layer 420. In some embodiments, the second conductive line 124 of second conductive path 120 is in the second interconnection layer 450. In some embodiments, the second conductive line 114 of first conductive path 110 is a bond wire (e.g., bond wire 460 in FIG. 4). In some embodiments, the second conductive line 124 of second conductive path 120 is a bond wire (e.g., bond wire 460 in FIG. 4). In some embodiments, the second conductive line 114 of first conductive path 110 is a ball bond (e.g., ball bond 470 in FIG. 4). In some embodiments, the second conductive line 124 of second conductive path 120 is a ball bond (e.g., ball bond 470 in FIG. 4). A single bond wire 460 or ball bond 470 is used for illustration. Other bond wires or ball bond configurations are within the contemplated scope of the present disclosure. For example, a different number of bond wires 460 or ball bonds 470 are within the contemplated scope of the present disclosure. In some embodiments, bond wire 460 or ball bond 470 is substituted with any other suitable configurations. For example, in some embodiments, wedge bonding or compliant bonding are substituted for ball bond 470.

Figure 2:
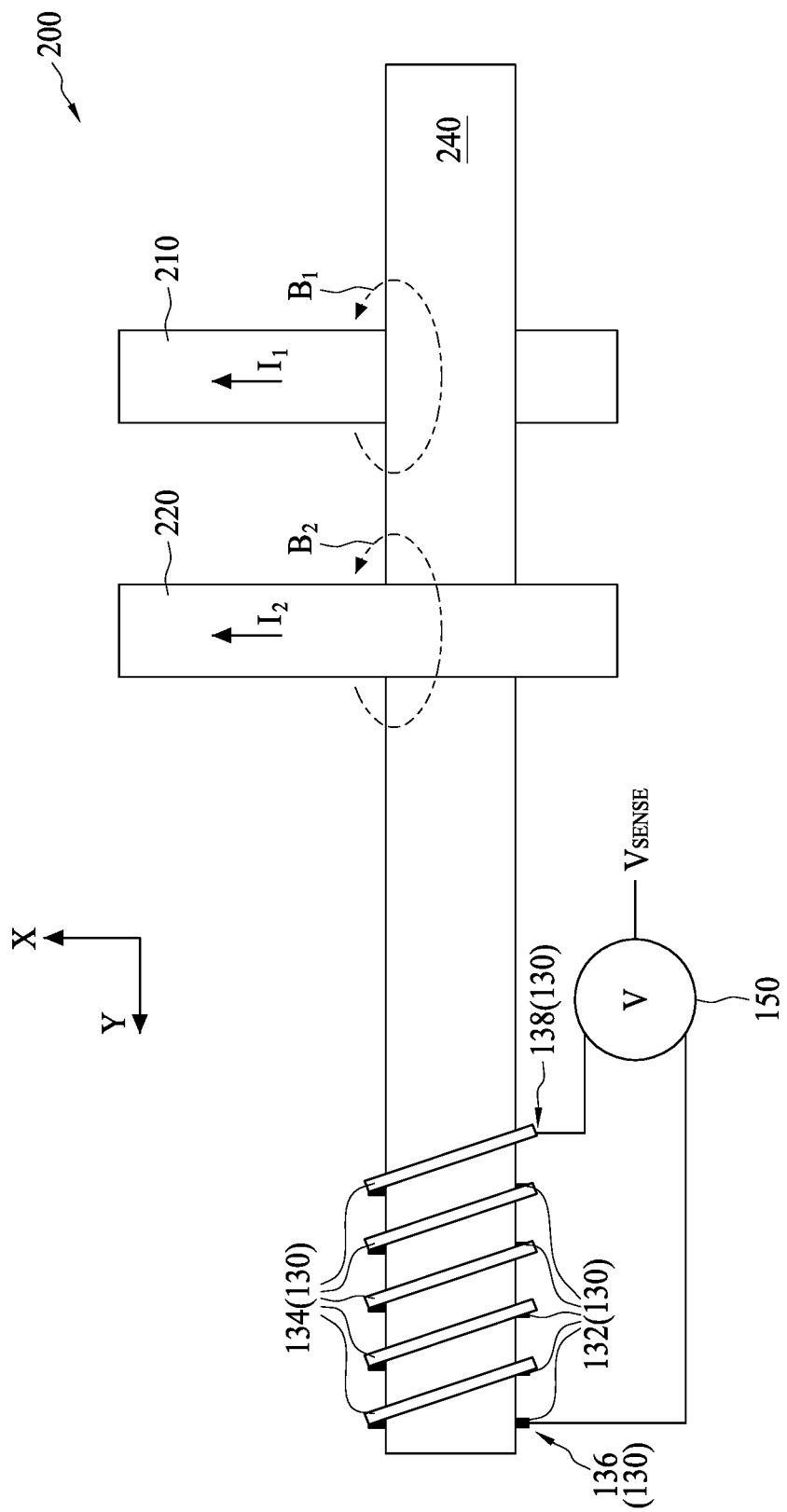
FIG. 2 is a top view of a portion of another integrated circuit in accordance with one or more embodiments.

FIG. 2 is a top view of a portion of another integrated circuit 200 in accordance with one or more embodiments. Components that are the same or similar to those in FIG. 1 are given the same reference numbers, and detailed description thereof is thus omitted. Integrated circuit 200 includes a substrate (e.g., 410 in FIG. 4), a first conductive path 210 over the substrate, a second conductive path 220 over the substrate, a coil structure 130 (not labeled in FIG. 2) over the substrate, a ferromagnetic structure 240 over the substrate, and a voltage sensing circuit 150.

First conductive path 210 extends along an X direction. First conductive path 210 is under ferromagnetic structure 240. In some embodiments, first conductive path 210 is over ferromagnetic structure 240. In some embodiments, first conductive path 210 is configured to carry a first time-varying current I1 and to generate a first time-varying magnetic field B1 based on first time-varying current I1.

Second conductive path 220 extends along X direction. Second conductive path 220 is over ferromagnetic structure 240. In some embodiments, second conductive path 220 is under ferromagnetic structure 240. In some embodiments, second conductive path 220 is configured to carry a second time-varying current I2 and to generate a second time-varying magnetic field B2 based on second time-varying current I2.

Two conductive paths 210 and 220 are explained as an example. In some embodiments, one of conductive paths 210 and 220 is omitted. In some embodiments, three or more conductive paths are arranged in a manner similar to conductive paths 210 and 220, and the current values of the three or more conductive paths are measured based on their corresponding magnetic fields.

Ferromagnetic structure 240 comprises a ferromagnetic strip extending along a Y direction. In some embodiments, ferromagnetic structure 240 has a magnetic permeability higher than a magnetic permeability of free-space or a magnetic permeability of a dielectric material (e.g., material 442 or passivation layer 430 in FIG. 4) adjacent to ferromagnetic structure 240. In some embodiments, ferromagnetic structure 240 has a material including cobalt, zirconium, or tantalum, or other suitable materials. In some embodiments, ferromagnetic structure 240 includes an alloy of cobalt, zirconium, and tantalum or other suitable materials. Coil structure 130 is wrapped around ferromagnetic structure 240 by a predetermined number of turns.

Based on the phases or directions of current I1 and current I2 and the Ampere's right-hand rule, first time-varying magnetic field B1 and second time-varying magnetic field B2 are superposed, as observed by the coil structure 130, in an additive manner or a subtractive manner. For example, if current I1 and current I2 are arranged in a same direction and do not have a phase offset, then the first time-varying magnetic field B1 and the second time-varying magnetic field B2, as observed by the coil structure 130, are additive and signal $V_{SENSE}$ is usable to measure an amplitude of current (I1+I2). For example, if current I1 and current I2 are arranged in an opposite direction and do not have a phase offset, then the first time-varying magnetic field B1 and the second time-varying magnetic field B2, as observed by the coil structure 130, are subtractive and signal $V_{SENSE}$ is usable to measure an amplitude of current (I1−I2). Therefore, depending on the configuration of conductive paths 210 and 220, signal $V_{SENSE}$ is usable to measure an amplitude of (I1+I2) or (I1−I2).

In some embodiments, integrated circuit 200 includes a first interconnection layer (e.g., one of the plurality of interconnection layers 420 in FIG. 4) over the substrate, and ferromagnetic structure 240 is over the first interconnection layer 420. In some embodiments, integrated circuit 200 includes a second interconnection layer (e.g., interconnection layer 450 in FIG. 4) over the substrate, and second interconnection layer 450 is over ferromagnetic structure 240. In some embodiments, a passivation layer (e.g., passivation layer 430 in FIG. 4) is over the first interconnection layer 420, and ferromagnetic structure 240 is over the passivation layer 430. The above-described structure is an example configuration, and other arrangements among elements of the integrated circuit 200 are within the contemplated scope of the present disclosure. In some embodiments, integrated circuit 400 has a different combination or ordering of layers than the configuration shown in FIG. 4. For example, in some embodiments, one or more of the first interconnection layer 420, the second interconnection layer 450, the ferromagnetic structure 240 or the passivation layer 430 are located on multiple layers of integrated circuit 200. For example, in some embodiments, one or more intervening layers (not shown) are located between the substrate and either the first interconnection layer 420 or the interconnection layer 450. For example, in some embodiments, one or more intervening layers (not shown) are located between the ferromagnetic structure 240 and the substrate.

In some embodiments, the first conductive path 210 is in first interconnection layer 420. In some embodiments, the second conductive path 220 is in second interconnection layer 450. In some embodiments, the second conductive path 220 is a bond wire (e.g., bond wire 460 in FIG. 4).

Figure 3:
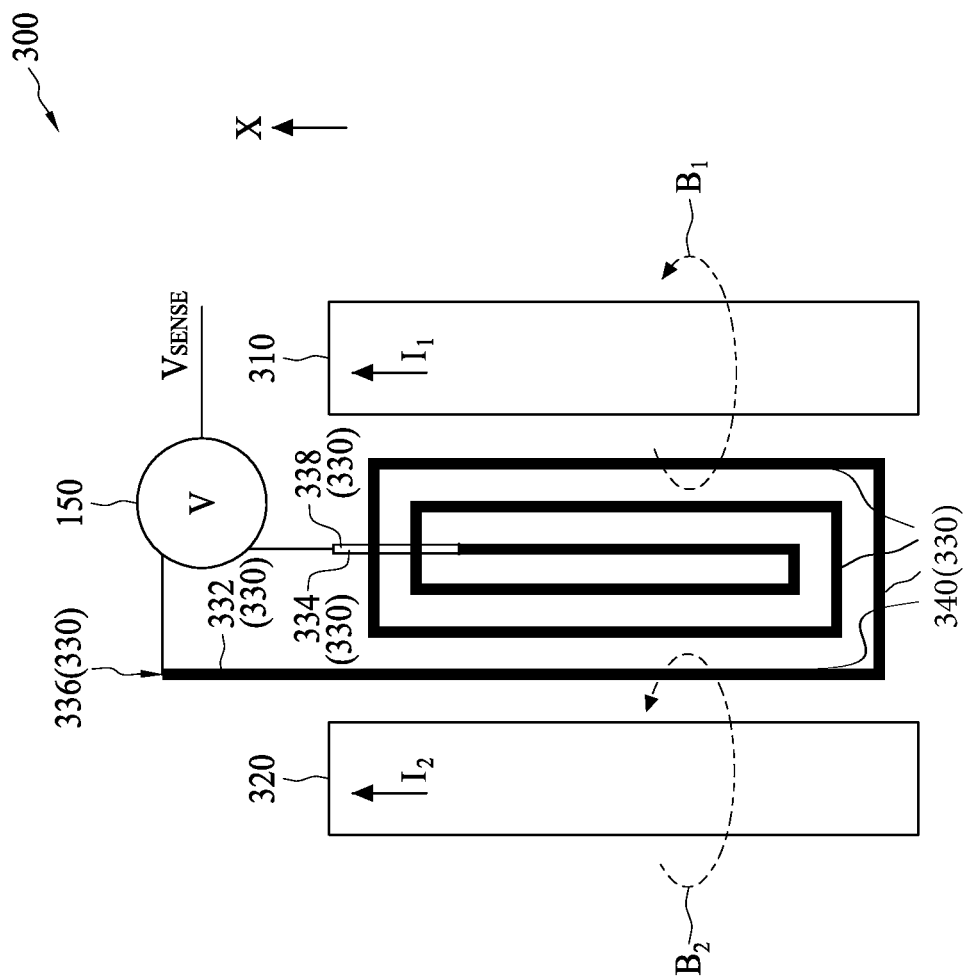
FIG. 3 is a top view of a portion of another integrated circuit in accordance with one or more embodiments.

FIG. 3 is a top view of a portion of another integrated circuit 300 in accordance with one or more embodiments. Components that are the same or similar to those in FIG. 1 are given the same reference numbers, and detailed description thereof is thus omitted. Integrated circuit 300 includes a substrate (e.g., 410 in FIG. 4), a first conductive path 310 over the substrate, a second conductive path 320 over the substrate, a coil structure 330 over the substrate, and a voltage sensing circuit 150.

First conductive path 310 extends along an X direction. In some embodiments, first conductive path 310 is configured to carry a first time-varying current I1 and to generate a first time-varying magnetic field B1 based on first time-varying current I1. Second conductive path 320 extends along X direction. In some embodiments, second conductive path 320 is configured to carry a second time-varying current I2 and to generate a second time-varying magnetic field B2 based on second time-varying current I2. In some embodiments, conductive paths 310 and 320 are in the same interconnection layer (e.g., one of the plurality of interconnection layers 420 or 450 in FIG. 4). In some embodiments, conductive paths 310 and 320 are in different interconnection layers (e.g., the plurality of interconnection layers 420 or 450 in FIG. 4). In some embodiments, the first conductive path 310 or the second conductive path 320 is a bond wire (e.g., bond wire 460 in FIG. 4). In some embodiments, the first conductive path 310 is a ball bond (e.g., ball bond 470 in FIG. 4). In some embodiments, the second conductive path 320 is a ball bond (e.g., ball bond 470 in FIG. 4). A single bond wire 460 or ball bond 470 is used for illustration. Other bond wires or ball bond configurations are within the contemplated scope of the present disclosure. For example, a different number of bond wires 460 or ball bonds 470 are within the contemplated scope of the present disclosure. In some embodiments, bond wire 460 or ball bond 470 is substituted with any other suitable configurations. For example, in some embodiments, wedge bonding or compliant bonding are substituted for ball bond 470.

Two conductive paths 310 and 320 are explained as an example. In some embodiments, one of conductive paths 310 and 320 is omitted. In some embodiments, three or more conductive paths are arranged in a manner similar to conductive paths 310 and 320, and the current values of the three or more conductive paths are measured based on their corresponding magnetic fields.

Coil structure 330 includes a spiral coil 332 in a first interconnection layer 420 and a connecting line 334 in a second interconnection layer 450. In some embodiments, spiral coil 332 is in a second interconnection layer 450 and the connecting line is in the first interconnection layer 420. In some embodiments, spiral coil 332 is coplanar with one or both of conductive paths 310 and 320. In some embodiments, spiral coil 332 is not coplanar with conductive paths 310 and 320. Spiral coil 332 includes a plurality of conductors 340 connected to each other in a winding configuration. In some embodiments, at least one conductor of the plurality of conductors 340 is coplanar with at least one conductor of the plurality of conductors 340. In some embodiments, at least one conductor of the plurality of conductors 340 is not coplanar with at least one conductor of the plurality of conductors 340.

Coil structure 330 is magnetically coupled with the first conductive path 310 and/or second conductive path 320 through the first time-varying magnetic field B1 and/or second time-varying magnetic field B2. Coil structure 330 is configured to generate an induced electrical potential responsive to the first time-varying magnetic field B1 and/or second time-varying magnetic field B2. The voltage level of the induced electrical potential is measurable from the ends 336 and 338 of coil structure 330.

Based on the phases or directions of current I1 and current I2 and the Ampere's right-hand rule, first time-varying magnetic field B1 and second time-varying magnetic field B2 are superposed, as observed by the coil structure 330, in an additive manner or a subtractive manner. Therefore, depending on the configuration of conductive paths 310 and 320, signal $V_{SENSE}$ is usable to measure an amplitude of (I1+I2) or (I1−I2).

Figure 4:
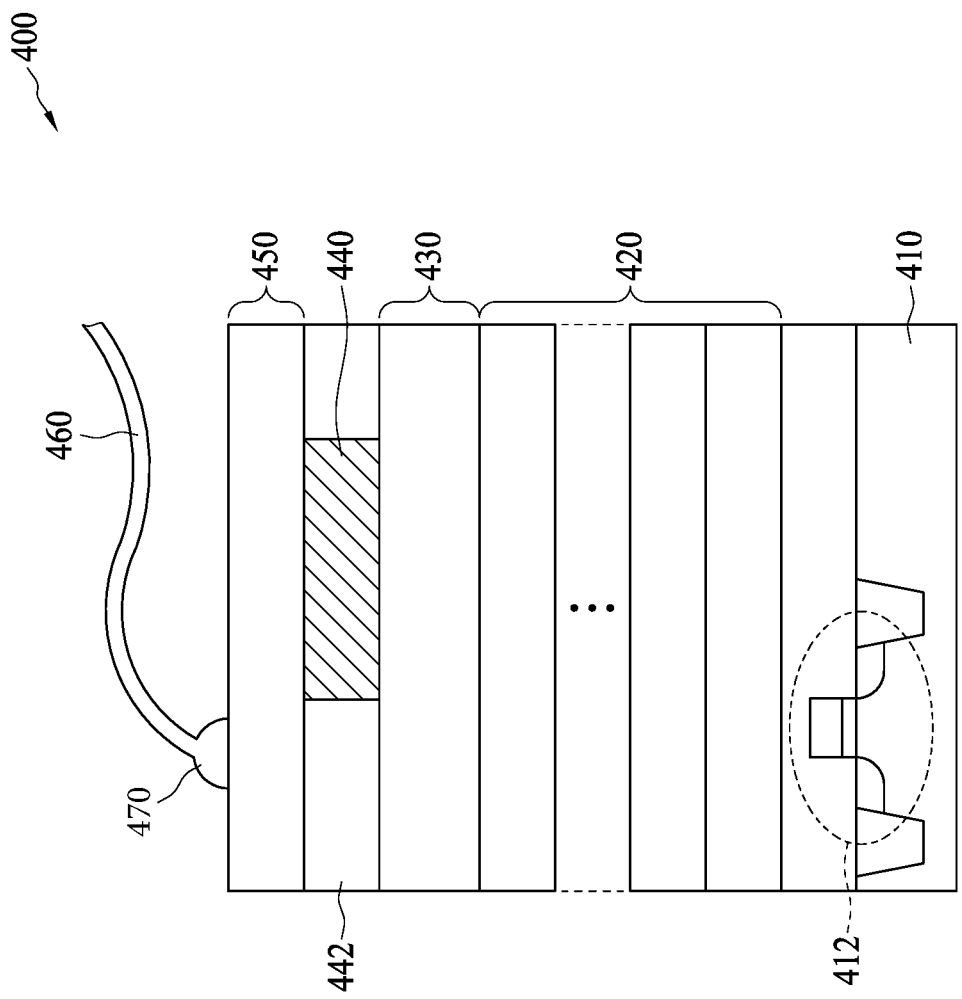
FIG. 4 is a cross-sectional view of a portion of an integrated circuit in accordance with one or more embodiments.

FIG. 4 is a cross-sectional view of a portion of an integrated circuit 400 in accordance with one or more embodiments. In some embodiments, integrated circuit 400 corresponds to integrated circuit 100, 200, or 300.

Integrated circuit 400 includes a substrate 410, a plurality of interconnection layers 420 over substrate 410, a passivation layer 430 over the plurality of interconnection layers 420, a ferromagnetic structure 440 over passivation layer 430 and surrounded by material 442, a post-passivation interconnection layer 450 over passivation layer 430, and a bond wire 460 over post-passivation interconnection layer 450. In some embodiments, bond wire 460 is not used. In some embodiments, bond wire 460 is connected to post-passivation interconnection layer 450 by a ball bond 470. In some embodiments, ferromagnetic structure 440 is at least partially embedded in passivation layer 430. In some embodiments, material 442 is a dielectric material. In some embodiments, material 442 is an extended portion of passivation layer 430. The above-described structure is an example configuration, and other arrangements among elements of the integrated circuit 400 are within the contemplated scope of the present disclosure. In some embodiments, bond wire 460 or ball bond 470 is substituted with any other suitable configurations. For example, in some embodiments, wedge bonding or compliant bonding are substituted for ball bond 470. In some embodiments, integrated circuit 400 has a different combination or ordering of layers than the configuration shown in FIG. 4. For example, in some embodiments, one or more selected from the group comprising the plurality of interconnection layers 420, the passivation layer 430, the ferromagnetic structure 440, the material 442, the post-passivation interconnection layer 450, the bond wire 460 or the ball bond 470, is located on multiple layers of integrated circuit 400. For example, in some embodiments, one or more intervening layers (not shown) are located between two layers selected from the group comprising the substrate 410, the plurality of interconnection layers 420, the passivation layer 430, the ferromagnetic structure 440, the material 442, the post-passivation interconnection layer 450, the bond wire 460 or the ball bond 470. For example, in some embodiments, one or more layers of integrated circuit 400, e.g., the plurality of interconnection layers 420, the passivation layer 430, the ferromagnetic structure 440, the material 442, the post-passivation interconnection layer 450, the bond wire 460 or the ball bond 470, are excluded.

In some embodiments, ferromagnetic structure 440 has a magnetic permeability higher than a magnetic permeability of free-space or a magnetic permeability of a dielectric material 442 adjacent to ferromagnetic structure 440. In some embodiments, ferromagnetic structure 440 has a material including cobalt, zirconium, or tantalum, or other suitable materials. In some embodiments, ferromagnetic structure 440 includes an alloy of cobalt, zirconium, and tantalum or other suitable materials. In some embodiments, ferromagnetic structure 440 corresponds to ferromagnetic structure 140, 240.

Integrated circuit 400 includes one or more electrical components 412 formed on substrate 410. In some embodiments, voltage sensing circuit 150 is formed by the one or more electrical components 412.

Figure 5:
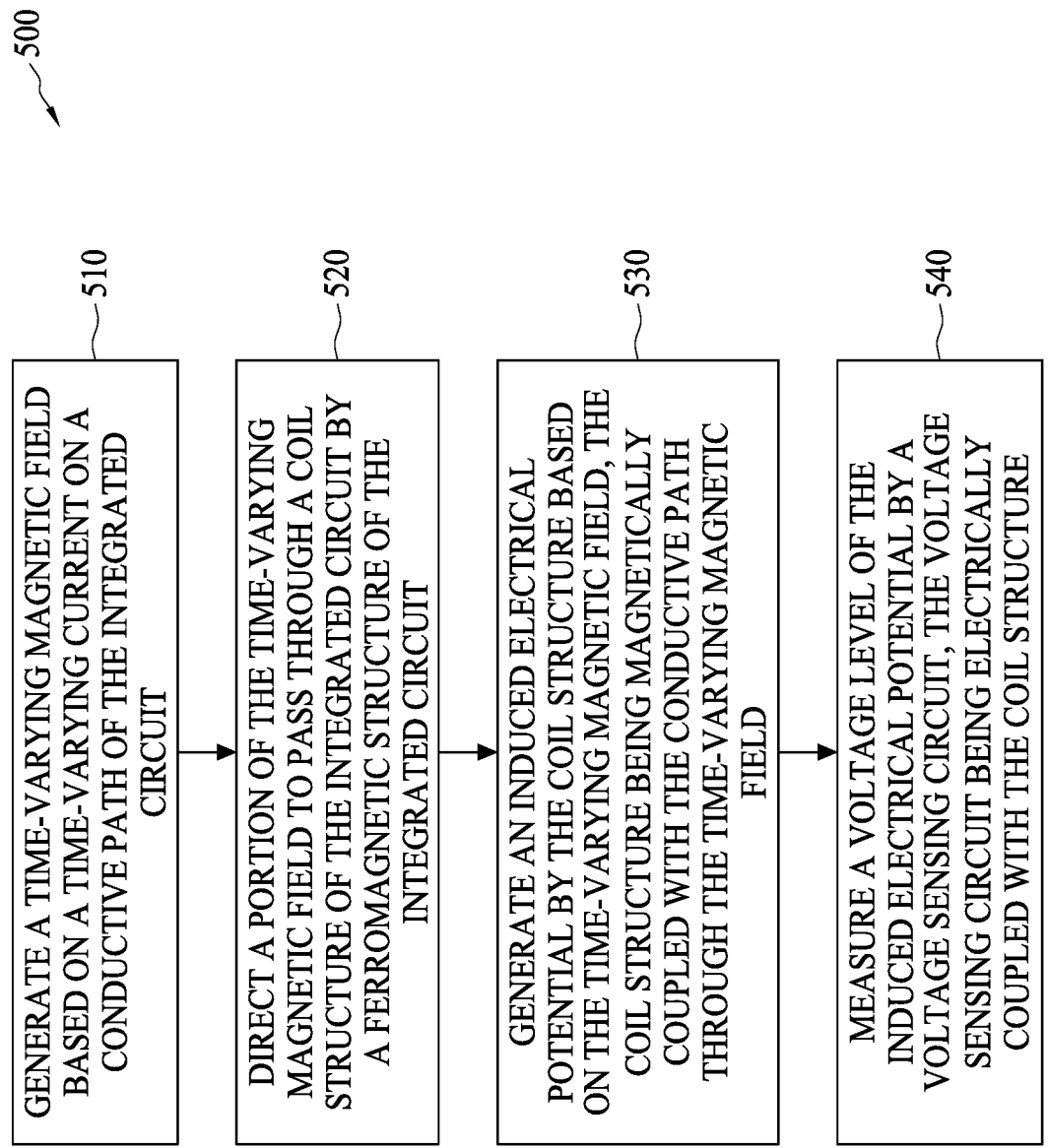
FIG. 5 is a flow chart of a method of operating an integrated circuit in accordance with some embodiments.

FIG. 5 is a flow chart of a method 500 of operating an integrated circuit in accordance with some embodiments. In the present disclosure, method 500 is illustrated based on integrated circuit 100 in FIG. 1. It is understood that additional operations may be performed before, during, and/or after the method 500 depicted in FIG. 5, and that some other processes may only be briefly described herein. In some embodiments, method 500 corresponds to operating integrated circuit 100, 200, or 300 as illustrated in conjunction with FIGS. 1-4.

The method 500 begins with operation 510, where a time-varying magnetic field, such as magnetic field B1 or B2, is generated based on a time-varying current, such as I1 or I2, on a conductive path of the integrated circuit.

The method 500 proceeds to operation 520, where a portion of the time-varying magnetic field, such as magnetic field B1 or B2, is directed to pass through a coil structure 130 by a ferromagnetic structure 140. In some embodiments, when ferromagnetic structure 140 is omitted, operation 520 is omitted.

The method 500 proceeds to operation 530, where an induced electrical potential is generated by the coil structure 130 responsive to the magnetic field, such as magnetic field B1 or B2. The coil structure 130 is magnetically coupled with the conductive path through at least a portion of the time-varying magnetic field.

The method 500 proceeds to operation 540, where a voltage level of the induced electrical potential is measured by a voltage sensing circuit 150. The voltage sensing circuit 150 is electrically coupled with the coil structure 130.

Figure 6A:
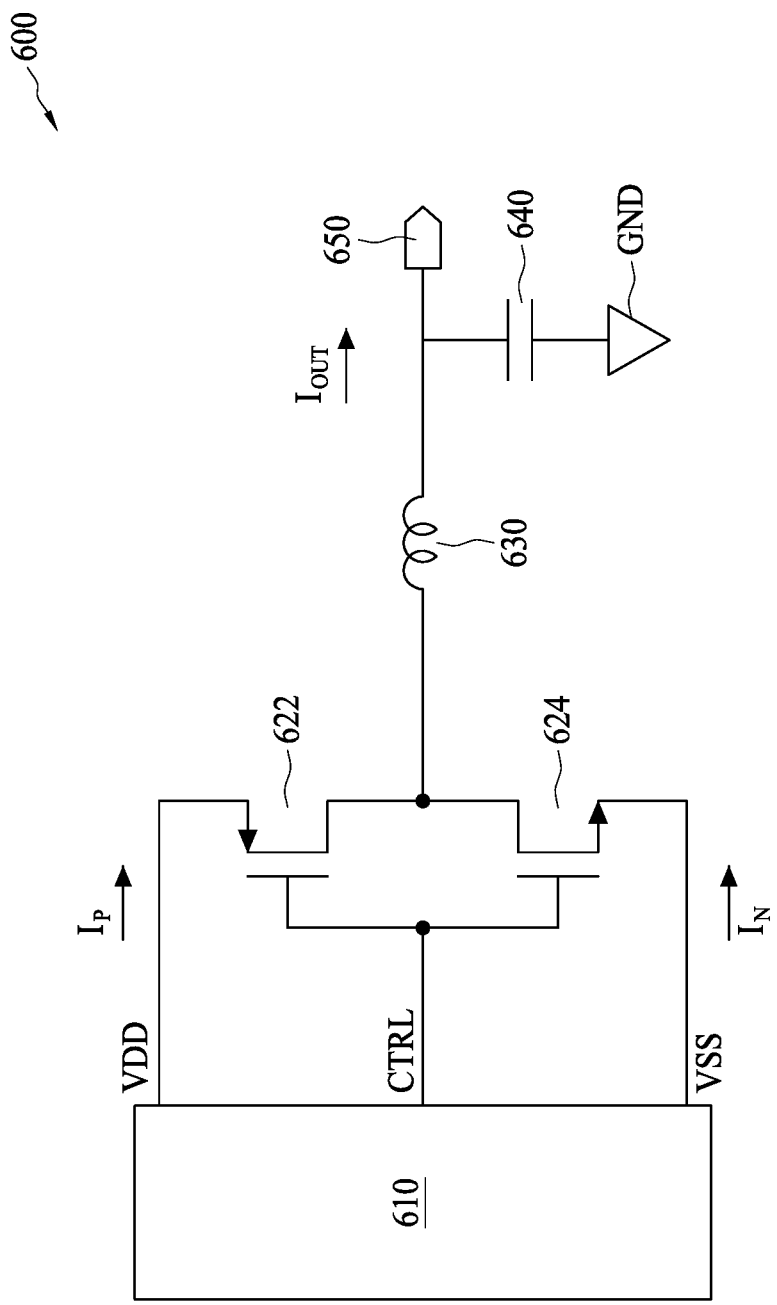
FIG. 6A is a circuit diagram of a regulator circuit in accordance with one or more embodiments.

FIG. 6A is a circuit diagram of a regulator circuit 600 in accordance with one or more embodiments. In some embodiments, regulator circuit 600 is usable to generate time-varying current I1 or time-varying current I2 in FIGS. 1-3. In some embodiments, current $I_P$ or $I_N$ corresponds to time-varying current I1 or time-varying current I2 in FIGS. 1-3, respectively. Regulator circuit 600 includes a control circuit 610, a high-side driver 622, a low-side driver 624, an inductor 630, a decoupling capacitor 640, and an output node 650.

Control circuit 610 is configured to output a first supply voltage VDD, a second supply voltage VSS, and a control signal to high-side driver 622 and low-side driver 624. High-side driver 622 is a PMOS transistor, and low-side driver 624 is an NMOS transistor. A source of high-side driver 622 is configured to receive voltage VDD, A source of low-side driver 624 is configured to receive voltage VSS, and drains of high-side driver 622 and low-side driver 624 are coupled together. Gates of high-side driver 622 and low-side driver 624 are coupled together and configured to receive control signal CRTL.

Inductor 630 is coupled between output node 650 and the drains of high-side driver 622 and low-side driver 624. Decoupling capacitor 640 is electrically coupled between output node 650 and ground GND. In operation, high-side driver 622 and low-side driver 624 are alternatively turned on to draw current $I_P$ from voltage VDD or current $I_N$ from voltage VSS. Current $I_{OUT}$ is thus the combination of current $I_P$ and current $I_N$.

Figure 6B:
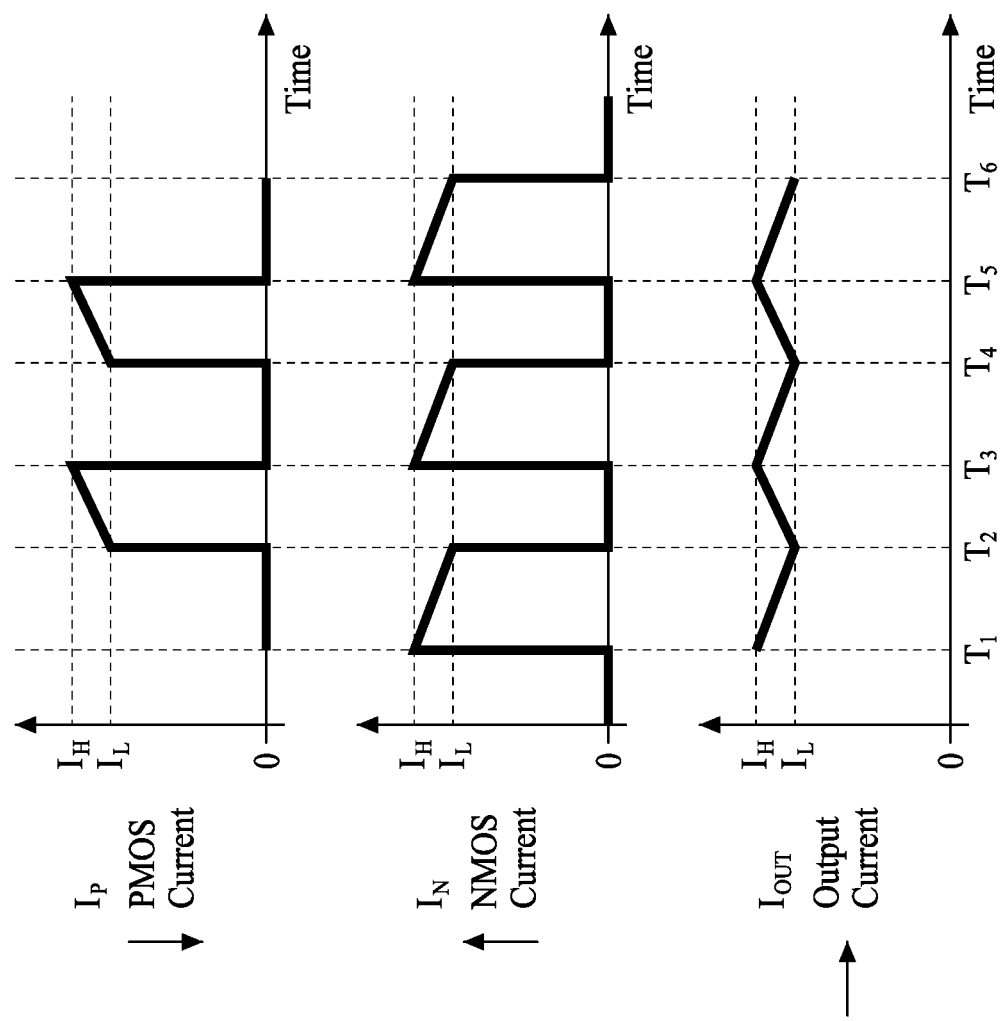
FIG. 6B is a timing diagram of various current signals of the regulator circuit in FIG. 6A in accordance with one or more embodiments.

FIG. 6B is a timing diagram of various current signals of the regulator circuit in FIG. 6A in accordance with one or more embodiments. As depicted in FIG. 6B, although current $I_{OUT}$ is a regulated current and has a characteristic similar to a direct current (DC) signal, current $I_P$ and current $I_N$ are time-varying signals.

At time $T_1$, low-side driver 624 is turned on and high-side driver 622 is turned off. Current $I_P$ is zero, and current $I_N$ transitions from zero to $I_H$. During the time period from time $T_1$ to time $T_2$, low-side driver 624 remains turned on and high-side driver 622 remains turned off. Current $I_P$ remains zero, and current $I_N$ gradually decreases to $I_L$, because the drains of high-side driver 622 and low-side driver 624 are electrically coupled with voltage VSS, which is lower than a predetermined output voltage at output node 650.

At time $T_2$, high-side driver 622 is turned on and low-side driver 624 is turned off. Current $I_N$ is zero, and current $I_P$ transitions from zero to $I_L$. During the time period from time $T_2$ to time $T_3$, high-side driver 622 remains turned on and low-side driver 624 remains turned off. Current $I_N$ remains zero, and current $I_P$ gradually increases to $I_H$, because the drains of high-side driver 622 and low-side driver 624 are electrically coupled with voltage VDD, which is higher than the predetermined output voltage at output node 650.

The operation of circuit 600 at time T3 and T5 is similar to that at time T1, and detailed description thereof is thus omitted. The operation of circuit 600 at time T4 and T6 is similar to that at time T2, and detailed description thereof is thus omitted.

In some embodiments, by measuring current $I_P$ and/or current $I_N$ using the circuit as illustrated in any of FIGS. 1-3, the value of current $I_{OUT}$ is measurable through the measured value of current $I_P$ and/or current $I_N$. In some embodiments, the measured value of current $I_P$ and/or current $I_N$, or the derived value of current $I_{OUT}$, are fed to control circuit 610 for controlling the high-side driver 622 and low-side driver 624. Various embodiments of the present disclosure are advantageous over other approaches. For example, some voltage regulators rely on voltage feedback control loops. In contrast, in various embodiments of the present disclosure as illustrated with reference to FIGS. 1-3, a voltage regulator is configured that relies on a current feedback control loop (e.g., implemented by circuits 100, 200 or 300). By implementing a coil-based current sensing voltage regulator as described in circuits 100 200, or 300, the coil-based current sensing voltage regulator has a faster response to transient events when compared with voltage regulators that rely on voltage feedback control loops. In some embodiments, coil-based current sensing voltage regulators have a larger bandwidth than other approaches. In some embodiments, coil-based current sensing voltage regulators are not as sensitive to temperature variations as are other approaches. In some embodiments, coil-based current sensing voltage regulators can be implemented on-chip since they are not as sensitive to electro-migration rules as are other approaches.

In accordance with one embodiment, an integrated circuit includes a substrate, a first conductive path over the substrate, a coil structure over the substrate, and a voltage sensing circuit electrically coupled with the coil structure. The first conductive path is configured to carry a first time-varying current and to generate a first time-varying magnetic field based on the first time-varying current. The coil structure is magnetically coupled with the first conductive path through the first time-varying magnetic field and is configured to generate an induced electrical potential responsive to the first time-varying magnetic field. The voltage sensing circuit is configured to measure a voltage level of the induced electrical potential.

In accordance with another embodiment, an integrated circuit includes a substrate, a ferromagnetic structure over the substrate, a conductive path over the substrate, and a coil structure over the substrate. The ferromagnetic structure has a portion extending along a first direction. The conductive path has a portion that is adjacent to the portion of the ferromagnetic structure and extends along a second direction different form the first direction. The coil structure is wrapped around the ferromagnetic structure.

In accordance with another embodiment, a method of operating an integrated circuit includes generating a time-varying magnetic field based on a time-varying current on a conductive path of the integrated circuit. An induced electrical potential is generated by a coil structure of the integrated circuit based on the time-varying magnetic field. The coil structure is magnetically coupled with the conductive path through the time-varying magnetic field. A voltage level of the induced electrical potential is measured by a voltage sensing circuit, the voltage sensing circuit being electrically coupled with the coil structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a substrate;
   a first conductive path over the substrate, the first conductive path being configured to carry a first time-varying current and to generate a first time-varying magnetic field based on the first time-varying current;
   a coil structure over the substrate, the coil structure being magnetically coupled with the first conductive path through the first time-varying magnetic field and being configured to generate an induced electrical potential responsive to the first time-varying magnetic field;
   a voltage sensing circuit electrically coupled with the coil structure and configured to measure a voltage level of the induced electrical potential; and
   a ferromagnetic structure over the substrate, the first conductive path extending through an open portion of the ferromagnetic structure, the first conductive path comprises:

a first conductive line below the ferromagnetic structure;
a second conductive line above the ferromagnetic structure; and
a via plug coplanar with the ferromagnetic structure, the via plug electrically connecting the first conductive line and the second conductive line.

2. The integrated circuit of claim 1, wherein
the coil structure is wrapped around the ferromagnetic structure by a predetermined number of turns.

3. The integrated circuit of claim 2, wherein the ferromagnetic structure comprises a material including cobalt, zirconium, or tantalum.

4. The integrated circuit of claim 2, further comprising:
a first interconnection layer over the substrate, the ferromagnetic structure being over the first interconnection layer; and
a second interconnection layer over the substrate, the second interconnection layer being over the ferromagnetic structure,
wherein the coil structure comprises:
    a first plurality of conductive lines in the first interconnection layer; and
    a second plurality of conductive lines in the second interconnection layer.

5. The integrated circuit of claim 4, wherein
the ferromagnetic structure comprises a ferromagnetic ring, wherein
    the first conductive line is in the first interconnection layer; and
    the second conductive line is in the second interconnection layer.

6. The integrated circuit of claim 4, wherein
the ferromagnetic structure comprises a ferromagnetic strip extending along a first direction; and
the first conductive path extends along a second direction different from the first direction.

7. The integrated circuit of claim 4, further comprising:
a passivation layer over the first interconnection layer, the ferromagnetic structure being over the passivation layer.

8. The integrated circuit of claim 1, wherein
the second conductive path is a portion of an interconnection layer or a bond wire over the substrate.

9. The integrated circuit of claim 1, further comprising:
a first interconnection layer over the substrate,
wherein the coil structure is in the first interconnection layer.

10. The integrated circuit of claim 9, further comprising:
a second interconnection layer over the substrate, the second interconnection layer and the first interconnection layer being one over the other,
wherein the second conductive line is a portion of the second interconnection layer.

11. The integrated circuit of claim 1, further comprising:
a second conductive path over the substrate, the second conductive path being configured to carry a second time-varying current and to generate a second time-varying magnetic field based on the second time-varying current,
wherein the coil structure is magnetically coupled with the second conductive path through the second time-varying magnetic field and being configured to generate the induced electrical potential responsive to the first time-varying magnetic field and the second time-varying magnetic field.

12. The integrated circuit of claim 11, wherein
the first time-varying magnetic field and the second time-varying magnetic field are superposed in an additive manner, as observed by the coil structure.

13. The integrated circuit of claim 12, wherein
the first time-varying magnetic field and the second time-varying magnetic field are superposed in an subtractive manner, as observed by the coil structure.

14. An integrated circuit, comprising:
a substrate;
a ferromagnetic structure over the substrate, the ferromagnetic structure having a portion extending along a first direction;
a conductive path over the substrate, the conductive path having a portion that is adjacent to the portion of the ferromagnetic structure and extends along a second direction different from the first direction, the conductive path comprises:
    a first conductive line in a first interconnection layer under the ferromagnetic structure;
    a second conductive line in a second interconnection layer over the ferromagnetic structure; and
    a via plug coplanar with the ferromagnetic structure, the via plug electrically connecting the first conductive line of the first interconnection layer and the second conductive line of the second interconnection layer; and
a coil structure over the substrate, the coil structure being wrapped around the ferromagnetic structure.

15. The integrated circuit of claim 14, wherein the ferromagnetic structure comprises a material including cobalt, zirconium, or tantalum.

16. The integrated circuit of claim 14, wherein
the first interconnection layer is over the substrate, the ferromagnetic structure being over the first interconnection layer; and
the second interconnection layer is over the substrate, the second interconnection layer being over the ferromagnetic structure,
wherein the coil structure comprises:
    a first plurality of conductive lines in the first interconnection layer; and
    a second plurality of conductive lines in the second interconnection layer.

17. The integrated circuit of claim 14, wherein
the ferromagnetic structure comprises a ferromagnetic ring.

18. The integrated circuit of claim 14, wherein
the ferromagnetic structure comprises a ferromagnetic strip extending along the first direction.

19. A method of operating an integrated circuit, comprising:
generating a time-varying magnetic field based on a time-varying current on a conductive path of the integrated circuit, the conductive path extending through an open portion of a ferromagnetic structure, the conductive path comprises:
    a first conductive line in a first interconnection layer under the ferromagnetic structure;
    a second conductive line in a second interconnection layer over the ferromagnetic structure; and
    a via plug coplanar with the ferromagnetic structure, the via plug electrically connecting the first conductive line of the first interconnection layer and the second conductive line of the second interconnection layer;
generating an induced electrical potential by a coil structure of the integrated circuit based on the time-varying magnetic field, the coil structure being magnetically coupled with the conductive path through the time-varying magnetic field; and measuring a voltage level of the induced electrical potential by a voltage sensing circuit, the voltage sensing circuit being electrically coupled with the coil structure.

20. The method of claim 19, further comprising:

directing a portion of the time-varying magnetic field to pass through the coil structure by the ferromagnetic structure of the integrated circuit.

* * * * *